METHOD OF MANUFACTURING SEMICONDUCTOR DEVICES

Filed June 29, 1966 2 Sheets-Sheet 1

INVENTOR.
JOHN J. SO
BY Norman N. Kunitz
Roger S. Borovoy
ATTORNEYS

METHOD OF MANUFACTURING SEMICONDUCTOR DEVICES

Filed June 29, 1966 2 Sheets-Sheet 2

INVENTOR.
JOHN J. SO
BY Norman N. Kunitz
Roger S. Borovoy
ATTORNEYS

United States Patent Office 3,404,451
Patented Oct. 8, 1968

3,404,451

METHOD OF MANUFACTURING SEMICONDUCTOR DEVICES

John J. So, Mountain View, Calif., assignor to Fairchild Camera and Instrument Corporation, Syosset, N.Y., a corporation of Delaware Filed June 29, 1966, Ser. No. 561,608
9 Claims. (Cl. 29—577)

ABSTRACT OF THE DISCLOSURE

The improvement in the method of making planar semiconductor devices wherein the oxide coating is stripped from the surface of the device after the predeposition step and before the diffusion step to achieve a continuous oxide coating with a flat exterior surface.

Figure 1:
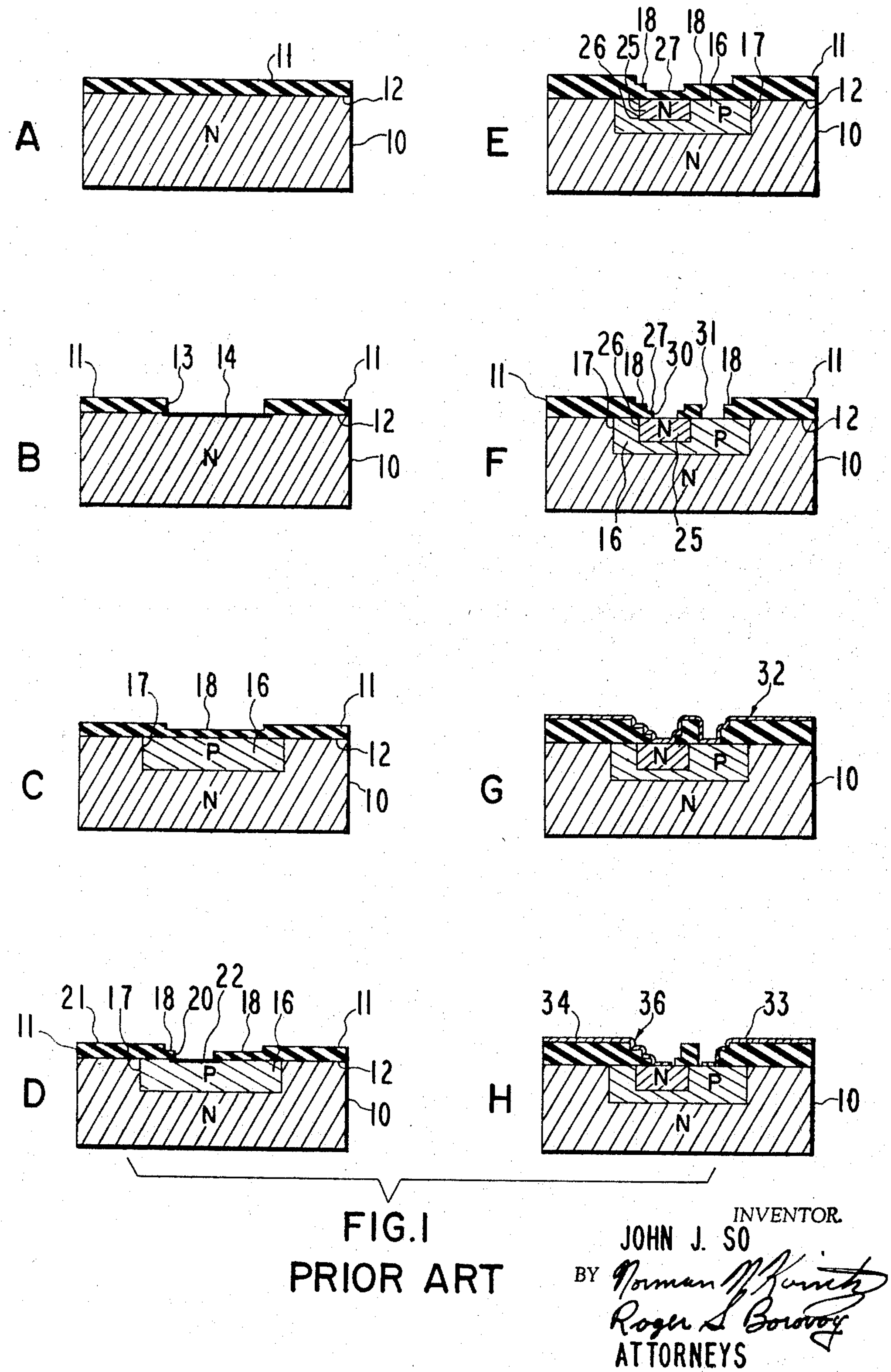
FIG. 1 PRIOR ART

This invention relates to an improved method of manufacturing semiconductor devices including both discrete devices such as transistors and combinations of devices such as integrated circuits. More particularly, this invention relates to an improved method of manufacturing planar semiconductor devices which is particularly useful in the manufacture or fabrication of the smaller and more complicated semiconductor devices now being produced.

In the manufacturing of planar semiconductor devices, for example, as shown in U.S. Patent 3,025,589 to J. A. Hoerni issued Mar. 20, 1962, the entire surface of the wafer or body of the semiconductor material is coated with an insulating layer, which in the case of silicon semiconductor material is normally a thermally grown layer of silicon dioxide. By means of photolithographic techniques including coating the surface of the insulating layer with a uniform layer of photoresist, exposing the same to a desired pattern on a photolithographic mask, and subsequent chemical etching, selected portions of the insulating layer are removed to expose the surface of the semiconductor body. A desired P-N junction may then be formed in the semiconductor body by predepositing the desired impurity material on the exposed surface of the body and then diffusing the impurity into the body by well known solid state diffusion techniques. The diffusion of the impurity material is normally carried out under such conditions that a layer of oxide is regrown over the previously exposed surface of the semiconductor body resulting in a continuous oxide layer across the entire surface. Additional junctions, for example in the case of double diffused transistor devices, may be formed in the wafer by selectively removing a portion of the regrown oxide layer by photolitographic techniques to expose the surface of the semiconductor body and then predepositing and diffusing the desired impurity into the body again under conditions whereby the oxide layer is regrown over the exposed portion. Electrical contacts to the various P-N junctions are then provided by once again selectively removing portions of the oxide to expose the surface of the wafer thereunder, evaporating a metal film over the entire surface of the oxide and selectively removing portions of the film by photoengraving techniques.

As is evident from the above description of the standard technique for manufacturing planar devices, the oxide covering of selected portions of the surface of the wafer is removed and regrown a number of times. Although the resulting oxide layer is often shown as having a flat surface, in fact this is not the case. Actually, each time that the oxide is regrown on a surface of the wafer, the resulting oxide layer is thinner in the regrown area than in the areas which were not selectively removed. Hence although the resulting oxide layer is continuous over the entire surface of the wafer, regions of various thicknesses exist in the oxide layer, resulting in what are normally called oxide steps, which may range in thickness from about 1000 A. to 10,000 A. The number of steps in an oxide surface corresponds to the number of masking operations necessary to diffuse the desired impurities into the semiconductor wafer. Various thicknesses of oxide and the resulting oxide steps are clearly shown on page 302 of Microelectronics by Edward Keonjian, McGraw-Hill, 1963.

Although the oxide steps do not usually present any serious problems when building or constructing semiconductor devices with relatively large geometries, as the geometries become smaller and smaller, the oxide steps begin to present increasingly greater problems in the manufacturing process for the semiconductor devices. One area in the manufacturing process where the oxide steps present a number of problems is during the photomasking operation. The first step in this operation is the depositing of a uniform thickness of photoresist on the surface of the oxide. Normally, this is done by depositing a globule of liquid photoresist on the wafer and then spinning the wafer about its central axis. However, due to the manner in which a liquid flows across an uneven surface, the oxide steps cause the resulting photoresist layer to be of non-uniform thickness, particularly in the regions adjacent the steps. For example, the upper surface of the resist may follow the contour of the oxide, in which case a step is produced in the resist layer. Moreover, the photoresist tends to build up at the foot of the oxide step and is relatively thin or nonexistent at the edges of the step. The result of all these irregularities in the oxide surface is that proper contact between the photolithographic mask and all portions of the resist surface is impossible, causing poor definition of the pattern to which the layer of photoresist is exposed and often the etching away of desired portions of the oxide, e.g., the area adjacent the edge of the oxide step.

Another problem occurring during the photomasking technique caused by the oxide steps is the alignment of the mask with the wafer so that the pattern exposed into the photoresist will be in the desired location. If the oxide steps are too deep, it may be difficult to focus both on the mask and on the pattern on the wafer in order to properly align the mask. This problem is particularly apparent for very small devices. Still a further problem which occurs during the photomasking technique is that of proper contact between the mask and the resist in order that the scattering and reflection of light passing through the mask be minimized. However, due to the oxide steps proper contact between the mask and the photoresist surface is not possible, resulting in poor definition of the exposed pattern in the photoresist.

Still another ill effect of the oxide steps is that they cause broken metalization, that is, the thin metal layers deposited on the surface of the oxide in the finished device for connection to the various regions of the device. This problem is especially acute in highly complex circuits with very small devices wherein the narrow metal strips crossing the steps are easily broken. Moreover, even those metal strips which are not broken as a result of poor definition of a pattern or the like, tend to be narrower at the oxide edge and thus increase the electrical resistance of the metal strip at this region. This increase in the resistance causes additional heating of the metal and eventually may lead to its destruction.

In addition to the photomasking and metallizing problems, another problem area which often results due to the oxide steps is that of staining of P-type regions. For example, such a problem may occur when it is necessary, particularly in integrated circuits, to provide a collector contact for an NPN transistor on the upper or top surface. In the case of an NPN transistor a heavy N+ diffusion must be made in the collector contact area to provide ohmic contact. In order to minimize the number of masking and diffusion operations, this heavy N+ diffusion is usually done during the emitter diffusion cycle, i.e., openings in the oxide layer to expose the emitter and the collector regions of the transistor are made at the same time. Since the oxide over the collector region usually is much thicker than that over the emitter region, the oxide in the emitter area is usually overetched. Because of the P-type conductivity of the base of such a transistor, the overetching often causes the emitter region to be stained, i.e., a dielectric layer is formed over the emitter region. This unwanted dielectric layer causes a number of problems which can often result in failure of the device being manufactured.

The present invention provides a method whereby the conventional oxide steps are eliminated or at least minimized, thus solving or eliminating the above problems in the manufacture of planar semiconductor devices. The improved method according to the invention is very similar to the standard planar technique described above, and includes the conventional steps of forming an oxide coating on a surface of the semiconductor body, removing a selected portion of the oxide coating to expose a portion of the surface of the semiconductor body, predepositing a selected impurity on the exposed surface, diffusing the impurity into the semiconductor body, and reforming the continuous oxide coating on the surface of the body. However, as opposed to the conventional method, wherein the original layer of oxide remains on the surface of the body, after the predeposition of the impurity on the exposed portion of the semiconductor body, the entire layer of oxide on the surface of the semiconductor body is removed or stripped off. Accordingly, the oxide layer which is regrown on the surface of the semiconductor body during the diffusion of the impurity therein is of substantially uniform thickness and contains no steps. It should be noted at this time that although the oxide layer formed according to the invention is referred to as being stepless, in fact a very small step may exist in the oxide layer over the diffused region. However, this step is so slight, in the order of about 50 A., that for purposes of providing a substantially uniform surface to eliminate the above mentioned problems, the step may be considered as nonexistant.

The method according to the invention and the advantanges thereof will be more clearly understood from the following detailed description taken in conjunction with the accompanying drawings wherein:

FIG. 1A–1H for sectional elevations through a semiconductor wafer illustrating the various stages of manufacture thereof in accordance with the prior art method; and, FIGS. 2A–2H are sectional elevations of the semiconductor device illustrating the various stages of the manufacture thereof according to the invention.

Before describing the improved method according to the invention, it is believed that a brief discussion and illustration of the general prior art method of producing planar semiconductor devices would be helpful in order that the differences, both in the methods and in the results, be readily visible. Refering now to FIGS. 1A–1H there is illustrated a double diffused transistor at various stages of manufacture thereof in accordance with the prior art method. As illustrated in FIG. 1A, a body or wafer 10 formed of semiconducting material such as silicon having a first conductivity type i.e., the semiconductor body 10 contains either an N or a P-type impurity. For purposes of the illustration of the method and as shown in the figures, the body 10 contains an N-type impurity. The wafer 10 has formed thereon as a step of the method an insulating layer 11 entirely covering the upper surface 12 of the semiconductor body 10. The insulating layer 11 is preferably formed of a silicon oxide produced by any of the various methods known in the art e.g., thermally grown by the action of oxygen on silicon at high temperature; or by exposure of the silicon wafer to moisture and air; or by pyrolytic deposition. It should be noted at this stage in the description of the method that the body 10 preferably forms a portion of a much larger silicon slice which is uniformly oxidized, and is subdivided into individual units at a later time, since processing of the larger slice is both more convenient and less costly.

The next step in the method comprises the selective removal of a portion of the oxide layer 11 to expose a desired portion of the surface 12 of the semiconductor body so that the oxide coating can function as a diffusion mask as indicated in FIG. 1B, by means of photoresist techniques and subsequent etching in a proper etching solution, e.g., a buffered hydrofluoric acid, an opening indicated by the reference numeral 13 is formed in the oxide layer 11. After making the hole or aperture 13, the next step in the manufacture of the semiconductor device is to deposit a desired impurity on the exposed portion of the surface 12, i.e., the portion of the surface 12 within the aperture 13. This step of depositing a desired impurity on the surface of a semiconductor body under controlled temperature conditions whereby the impurity does not diffuse significantly into the body but rather forms surface compounds therewith is usually referred to in the art as "predeposition." With an N-type silicon body, the impurity predeposited on the surface of the wafer 10, and indicated by the reference numeral 14, would be one of the known acceptor impurities, usually a Group III element. The predeposition may, as indicated in FIG. 1B, preferably be carried out in an inert atmosphere whereby substantially no oxidation of the surface 12 within the aperture 13 occurs, or be carried out in an oxidizing atmosphere whereby a thin layer of silicon oxide will be formed on the exposed portion of surface 12.

The next step in the method is the diffusion of the predeposited impurity 14 into the body 10 by solid state diffusion techniques. This is carried out by applying sufficient heat to the body 10 to raise the temperature thereof to a temperature where diffusion takes place at an appreciable rate. The diffusion of the impurity into the body 10 produces a region 16 (FIG. 1C) of P-type silicon therein and results in the production of a P-N junction 17 which extends to the surface 12. Since the diffusion is carried out in an oxidizing atmosphere, a fresh layer of oxide, indicated generally by the numeral 18 is grown over the portion of the surface 12 within the aperture 13 so that at the completion of the diffusion step, a continuous layer of oxide is again present on the surface 12. It should be pointed out at this time that as indicated in the figure, the resulting oxide portion 18 is thinner than the remainder of the oxide layer—thus producing the first oxide step. This difference in oxide thickness is caused by the fact that actually the entire surface 12 of the body 10 is oxidized during the diffusion step with the freshly grown oxide being formed beneath the already existing oxide layer 11.

The next step in the production of the double diffused planar transistor is the selective removal of a portion of the oxide layer 11 to expose the surface 12 above the region 16 for the purpose of diffusing another impurity into the region 16. In order to expose the desired portion of the surface 12, an aperture 20 (FIG. 1D) is formed in the portion 18 of the oxide layer by standard photoresist and etching processes as with the aperture 13. Obviously, since a photomask placed in contact with the upper surface 21 of layer 11 cannot contact the upper surface of the portion 18, poor definition of the pattern for the opening 20 and difficulty in aligning the mask often results.

Following the formation of the aperture 20, a desired impurity, indicated generally by the reference numeral 22 in FIG. 1D is deposited on the exposed portion of the surface 12 in a similar manner used for depositing the impurity 14. The impurity 22 may be any of the known donor impurities, for example, an element from Group V of the periodic table.

As shown in FIG. 1D, the body 10 is then again subjected to an increased temperature in an oxidizing atmosphere to cause the impurity 22 to be diffused into the region 16 to produce an N-type region 25 and a planar P-N junction 26. The planar double diffused transistor is now essentially complete, except for contacts to the various electrodes or regions of the semiconductor material, with the body 10 corresponding to the collector and the regions 16 and 25 corresponding respectively, to the base and the emitter of the transistor.

As also indicated in FIG. 1E, a fresh oxide portion 27 is again regrown over the portion of the surface 12 within the aperture 20, which portion is thinner than the oxide on all other portions of the surface 12. As can easily be seen there are now two oxide steps caused by the different thicknesses of the oxide layer portions 18 and 27. Accordingly, any further photomasking operations required to complete the transistor will present greater problems than those encountered when producing the aperture 20. These problems are due to the increased difference in depth between the uppermost surface of the oxide layer 11 and the upper surface of the oxide portion 27.

In order to complete the transistor structure, electrical leads or conductors must be ohmically connected to the base, emitter, and collector regions. As shown in FIG. 1F, a pair of openings 30 and 31 are formed by photomasking techniques in the oxide layer to expose a portion of the surface 12 over the regions 25 and 16 respectively, and then a layer of metal 32 (FIG. 1G) is deposited by any of the well-known techniques in the art over the entire surface of the oxide layer and the exposed surfaces of regions 16 and 25, to which it makes ohmic electrical contact. Following the deposition of the metal film 32, undesired portions thereof are removed, again using photomasking techniques to produce a pair of contacts 33 and 34 connected to the regions 16 and 25 respectively. An electrical connection (not shown) for the collector region, i.e., the N-type body, may be provided by means of a metal layer on the bottom surface 35 of the body or by opening another aperture in the oxide layer. A method of forming the electrical contacts is described in U.S. Patent 3,108,359 issued Oct. 29, 1963 to G. E. Moore and R. N. Noyce. It should again be pointed out at this time that the last two masking operations, i.e., for the deposition of the metal film, and for the selective removal of the metal, are carried out under very difficult conditions, i.e., with two oxide steps and hence the chances of misalignment of the masks and of poor definition of the exposed patterns is greatly increased, thereby increasing the possibility of faulty devices.

In addition to the photomasking problems caused by the oxide steps, as mentioned above, the oxide steps also cause metalization problems. Although in theory a uniform layer of metal is deposited along the entire surface of the oxide, in practice the metal at the edges of the oxide steps is thinner than that on the flat surfaces. Accordingly, the narrow metal strips or conductors remaining after the selective removal of the metal tend to break where they cross the steps. Moreover, it has been found as previously indicated, that the metal strips tend to get narrower in width at the oxide edge, e.g., edge 36, thus increasing the electrical resistance of the conductor in that region and rendering the narrow portion susceptible to destruction due to excessive heat when a current is passed through the conductor.

Figure 2:
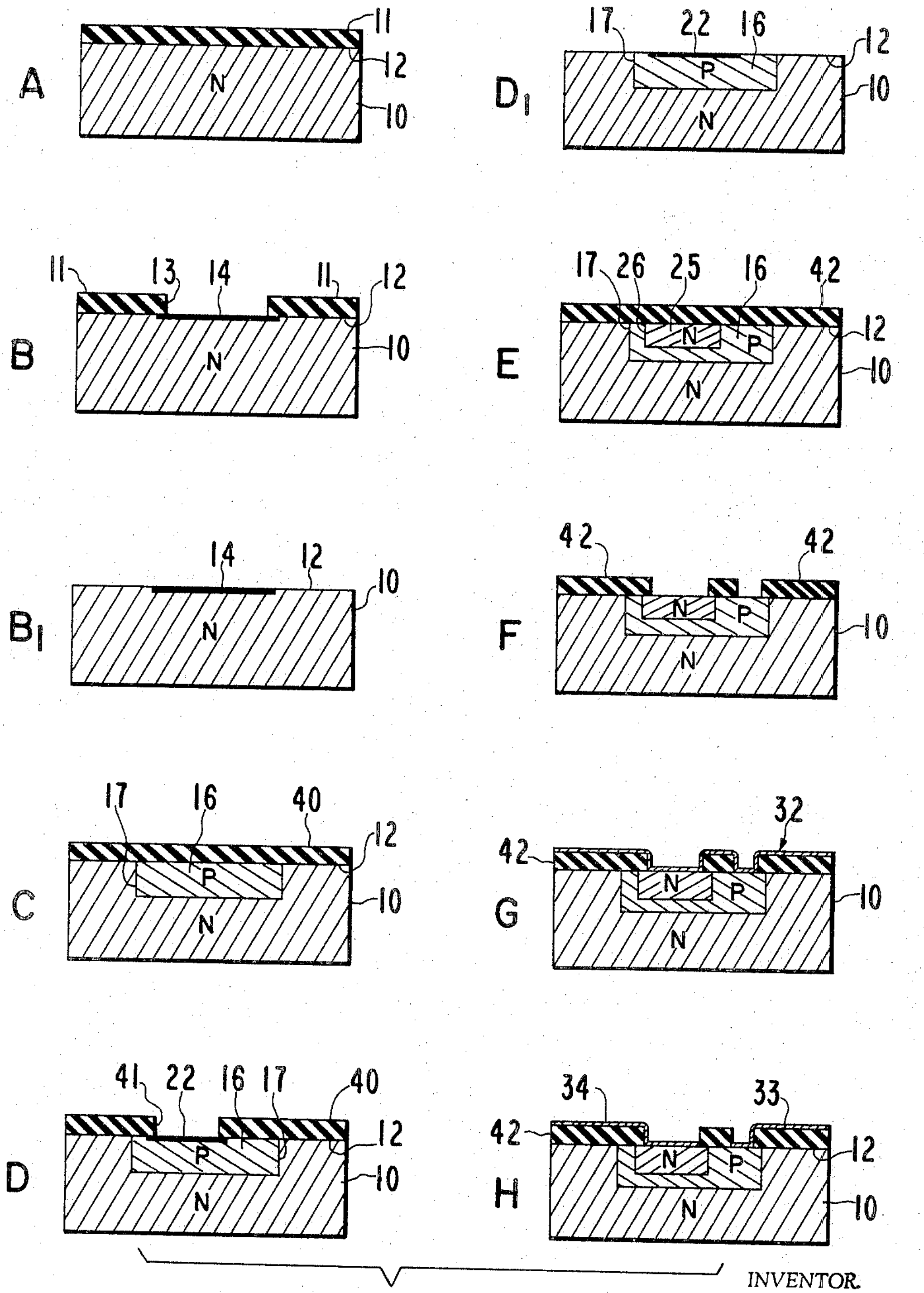

Turning now to FIGS. 2A–2H, the improved method according to the invention will be described. In these figures, structures or portions thereof which are the same as those in FIGS. 1A–1H are designated with the same reference number. As can easily be seen from a comparison of FIGS. 1A and 1B with FIGS. 2A and 2B, the initial steps leading to predeposition of the first impurity on the surface 12 are the same in both methods. However, as shown in FIG. 2B, prior to the diffusion of the predeposited impurity 14 into the body 10, the dielectric layer 11 is stripped or removed from the surface 12. This stripping may be accomplished according to the preferred embodiment wherein the dielectric is a layer of oxide, by the use of a suitable oxide etchant such as hydrofluoric acid. The body 10 with the impurity 14 on the surface thereof as shown in FIG. 2B, is then preferably washed thoroughly with distilled water to remove the hydrofluoric acid. It is then blown or spun dry and passed as soon as possible into the diffusion furnace to prevent contamination of the surface 12 by impurities in the atmosphere.

Diffusion of the impurity 14 into the body 10 is then carried out, as with the method of FIG. 1, using standard solid state diffusion techniques in an oxidizing atmosphere. As shown in FIG. 2C, following the diffusion step the region 16 and its associated P–N junction 17 are formed in the body 10 just as with the prior art method. However, instead of an oxide layer having two different thicknesses, i.e., an oxide step, a completely new layer of oxide 40 having a uniform thickness is grown over the entire surface 12 of the body 10 during the diffusion.

Following the diffusion of the base region 16 into the body 10, and in order to diffuse the emitter region 25 into the region 16, a portion of the oxide layer over the region 16 is removed by standard photoresist and etching techniques to form the opening 41 and expose a portion of the surface 12. Due to the substantially flat surface of the oxide layer 40, a uniform planar layer of photoresist may be deposited on the exposed surface of the layer 40 resulting in good contact between the photomask and the upper surface of the resist and good definition in the pattern exposed into the photoresist. Moreover, due to the fact that all of the objects or lines on the surface of the body 10 are in the same place, the alignment problems are greatly simplified.

Following the formation of the aperture 41 the desired impurity 22 (FIG. 2D) is again predeposited on the exposed surface of the body 10 as in the prior art method. As shown in FIG. 2D, however, prior to the diffusion of the deposited impurity 22 in a preferred embodiment of the invention, the oxide layer 40 is again stripped from the surface 12 using the same or a similar procedure as that used to strip the oxide layer 11. The stripped wafer is then again washed with distilled water and passed into a diffusion furnace wherein the impurity 22 is diffused into the body 16 in an oxidizing atmosphere to form the region 25 and the P-N junction 26. As with the oxide layer 40 formed during the diffusion of the impurity 14, the new oxide layer 42 formed during the formation of the region 25 has a uniform thickness and therefore a substantially flat surface, i.e., an absence of oxide steps.

The remaining steps of the improved method necessary to provide the electrical connection to the regions 16 and 25 are the same as those in the conventional prior art method, e.g., compare FIGS. 1F–1H with FIGS. 2F–2H respectively. However, as is evident from a comparison of these figures, the metal conductors 34 and 33 do not cross any oxide steps, thus eliminating the problems caused thereby of broken or narrow metalization. Moreover, as is also evident from FIGS. 2F–2H, the absence of the oxide steps in the final masking operations permits better definition of the exposed patterns.

Although the preferred embodiment of the method according to the invention requires that the oxide layer be stripped following each predeposition, it is to be understood that this is not always necessary. Since the removal of any of the oxide steps during the manufacture of the transistor will reduce the problems caused thereby, the removal of the oxide layer either after the predeposition of the base region or of the emitter region impurity is considered within the scope of this invention.

It is to be further understood that although the invention has been specifically described for the manufacture of a transistor that the invention may equally well be applied to planar integrated semiconductor circuits or other planar devices.

Obviously, various other modifications of the disclosed method are possible in light of the disclosure without departing from the spirit of the invention. Accordingly, the invention is to be limited only as indicated by the scope of the appended claims.

What is claimed is:

1. In a method of making planar semiconductor devices including the steps of forming an oxide coating on a surface of a semiconductor body, removing a selected portion of the said oxide coating to expose the surface of said semiconductor body, predepositing a selected impurity on said exposed surface, controllably diffusing said impurity into said semiconductor body, and reforming a continuous oxide coating on said surface of said body, the improvement comprising: stripping the oxide coating from said surface after the said predeposition step but before the said diffusion step, whereby said reformed continuous oxide coating has an improved flatter exterior surface.

2. The method of claim 1 wherein said continuous oxide coating is reformed during said diffusion step.

3. The method of claim 2 including the steps of:

removing a portion of said reformed oxide coating to expose a portion of the semiconductor body containing said diffused impurity; and attaching an ohmic contact to the exposed portion of said semiconductor body.

4. In a method of manufacturing planar semiconductor devices including the steps of forming an oxide layer on a surface of a semiconductor body of a first conductivity type, forming an opening in said oxide layer to expose the said surface of said semiconductor body, predepositioning a first selected impurity on said exposed surface; controllably diffusing at an elevated temperature said first impurity into said semiconductor body to form a P-N junction extending to said surface, while regrowing a continuous layer of oxide on said surface, forming a second smaller opening in said regrown portion of said oxide layer above the region of said semiconductor body into which said first impurity has been diffused to expose said surface, predepositing a second selected impurity on the exposed surface, and then diffusing at elevated temperature said second selected impurity into said semiconductor body to form a second P-N junction between the first mentioned P-N junction and said surface while regrowing a continuous layer of oxide on said surface, the improvement comprising: removing the said oxide layer from said surface after the predeposition of said first impurity but before the diffusion thereof into said semiconductor body.

5. The method of claim 4 including: removing the said oxide coating from said surface after the predeposition of said second impurity but before the diffusion thereof whereby the oxide coating regrown during said second diffusion has a substantially flat exterior surface.

6. The method of claim 4 including: after said second diffusion step, forming a plurality of openings in said oxide coating to expose portions of the semiconductor body containing said first and second impurities to provide for attachment of electrical contacts.

7. The method of claim 6 wherein the electrical contacts are attached to exposed portions of said semiconductor body by depositing a thin layer of metal on the exposed surface of said oxide coating with said metal filling said openings and making ohmic contact with the said exposed portions of said semiconductor body; and selectively removing portions of said metal layer to form a desired pattern of conductive paths.

8. In a method of manufacturing planar junction semiconductor devices including the steps of forming an oxide layer on a surface of a semiconductor body, opening a hole in said layer to expose a desired limited portion of said surface of said semiconductor body, predepositing a first selected impurity on said exposed surface, diffusing said first impurity into said semiconductor body to form a P-N junction which extends to said surface while simultaneously growing a continuous layer of oxide on said surface, opening a smaller hole in said oxide layer above the region of said semiconductor body into which said first impurity has been diffused to expose said surface, predepositing a second impurity on said exposed surface, diffusing said second impurity into said semiconductor body to form a second P-N junction between the first mentioned P-N junction and said surface while simultaneously regrowing a continuous layer of oxide on said surface, opening a plurality of holes in the oxide layers to expose a portion of each of the regions of said body containing said diffused impurities, depositing a layer of metal on the surface of the oxide layers which fills said plurality of openings and makes ohmic contact with the exposed surface of each of said regions, and selectively removing portions of said metal layer to provide separate conductive paths to each of said regions, the improvement comprising: removing the oxide layer from said surface after the predeposition of said first impurity but before the diffusion thereof into said semiconductor body.

9. The method of claim 8 including the step of removing the oxide layers from said surface after the predeposition of said second impurity but before the diffusion thereof into said semiconductor body.

References Cited

UNITED STATES PATENTS

| | | | |
|---|---|---|---|
| 2,981,877 | 4/1961 | Noyce. | |
| 3,146,135 | 8/1964 | Sah. | |
| 3,177,100 | 4/1965 | Mayer et al. | |
| 3,212,162 | 10/1965 | Moore | 29—578 |

WILLIAM I. BROOKS, *Primary Examiner.*